United States Patent
Park et al.

(10) Patent No.: US 8,302,290 B2
(45) Date of Patent: Nov. 6, 2012

(54) APPARATUS FOR MOUNTING ELECTRONIC PARTS

(75) Inventors: Jun-Kyu Park, Paju-si (KR); Sang-Mun Shin, Paju-si (KR); Gweon-Young Park, Gumi-si (KR); Byung-Chul Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/850,605

(22) Filed: Aug. 4, 2010

(65) Prior Publication Data

US 2011/0030208 A1 Feb. 10, 2011

(30) Foreign Application Priority Data

Aug. 4, 2009 (KR) .................. 10-2009-0071603

(51) Int. Cl.
*B23P 19/00* (2006.01)
(52) U.S. Cl. ............................. 29/739; 29/740
(58) Field of Classification Search ............ 29/739–741, 29/729, 742
See application file for complete search history.

(56) References Cited

U.S. PATENT DOCUMENTS

| | | | | |
|---|---|---|---|---|
| 4,706,379 A * | 11/1987 | Seno et al. | | 29/740 |
| 5,541,834 A * | 7/1996 | Tomigashi et al. | | 700/59 |
| 5,727,311 A * | 3/1998 | Ida et al. | | 29/832 |
| 5,768,759 A * | 6/1998 | Hudson | | 29/407.04 |
| 5,809,639 A * | 9/1998 | Alvite | | 29/740 |
| 5,862,588 A * | 1/1999 | Heim et al. | | 29/840 |
| 5,933,942 A * | 8/1999 | Kitamura et al. | | 29/740 |
| 6,000,123 A * | 12/1999 | Munezane et al. | | 29/740 |
| 6,047,874 A * | 4/2000 | Asai et al. | | 226/110 |
| 6,079,096 A * | 6/2000 | Hata et al. | | 29/740 |
| 6,249,943 B1 * | 6/2001 | Matsushita et al. | | 29/33 M |
| 6,273,666 B1 * | 8/2001 | Barnowski et al. | | 414/403 |
| 6,336,548 B1 * | 1/2002 | Asai et al. | | 198/468.4 |
| 6,446,331 B1 * | 9/2002 | Horigome | | 29/832 |
| 6,516,514 B1 * | 2/2003 | Pruefer | | 29/832 |
| 6,651,316 B2 * | 11/2003 | Isogai et al. | | 29/739 |
| 6,662,966 B2 * | 12/2003 | Desai et al. | | 221/1 |
| 6,684,494 B2 * | 2/2004 | Ambe | | 29/832 |
| 6,739,045 B2 * | 5/2004 | Kimura et al. | | 29/840 |
| 6,779,252 B2 * | 8/2004 | Tracy et al. | | 29/739 |
| 7,028,390 B2 * | 4/2006 | Satoh et al. | | 29/739 |
| 7,089,655 B2 * | 8/2006 | Isogai et al. | | 29/740 |
| 7,239,399 B2 * | 7/2007 | Duquette et al. | | 356/614 |
| 7,730,606 B2 * | 6/2010 | Forster et al. | | 29/729 |
| 8,015,697 B2 * | 9/2011 | Park et al. | | 29/740 |

* cited by examiner

*Primary Examiner* — David Angwin
(74) *Attorney, Agent, or Firm* — Birch, Stewart, Kolasch & Birch, LLP

(57) ABSTRACT

An apparatus for mounting electronic parts includes a bulk feeder into which electronic parts in a bulk form are introduced, at least one inspection unit to inspect and align the electronic parts directed from the bulk feeder, an electronic part insertion unit to receive the electronic parts which have been completely inspected in the inspection unit, a positioning wheel installed to rotate along the bulk feeder, the inspection unit, and the electronic part inspection unit and serving to transfer the electronic parts, and a part supply unit to pick up the electronic parts received in the part insertion unit.

8 Claims, 10 Drawing Sheets

APPARATUS FOR MOUNTING ELECTRONIC PARTS

This application claims the priority benefit of Korean Patent Application No. 10-2009-0071603, filed on Aug. 4, 2009, which is hereby incorporated by reference as if fully set forth herein.

BACKGROUND OF THE INVENTION

1. Field of the Invention

The present invention relates to an apparatus and method for mounting electronic parts, which are capable of reducing costs.

2. Discussion of the Related Art

Generally, once a supplier provides a manufacturer with electronic parts, the manufacturer mounts the electronic parts on a printed circuit board by use of an electronic part mounting apparatus.

More specifically, a supplier should perform die bonding, wire bonding, and dispensing processes on electronic parts and then, classify the electronic parts according to voltage, brightness, and color coordinate, and finally, pack the classified electronic parts by reel taping.

A manufacturer performs a sampling test on the electronic parts provided from the supplier, prior to introducing the electronic parts into an electronic part mounting apparatus. To mount the electronic parts on a printed circuit board, the electronic part mounting apparatus should first remove a tape attached to the introduced electronic parts.

As described above, the supplier should invest in material preparation and handling, labor costs, equipment costs, and construction of a clean room for the reel taping of electronic parts and the packing of the taped electronic parts, thus suffering from enormous investment costs. Likewise, the manufacturer should invest in material preparation and handling, labor costs, equipment costs, and construction of a clean room to remove tapes from the electronic parts, thus suffering from enormous investment costs.

SUMMARY OF THE INVENTION

Accordingly, the present invention is directed to an apparatus and method for mounting electronic parts that substantially obviate one or more problems due to limitations and disadvantages of the related art.

An object of the present invention is to provide an apparatus and method for mounting electronic parts, which are capable of reducing costs.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electronic part mounting apparatus includes a bulk feeder into which electronic parts in a bulk form are introduced, at least one inspection unit to inspect and align the electronic parts directed from the bulk feeder, an electronic part insertion unit to receive the electronic parts which have been completely inspected in the inspection unit, a positioning wheel installed to rotate along the bulk feeder, the inspection unit, and the electronic part inspection unit and serving to transfer the electronic parts, and a part supply unit to pick up the electronic parts received in the part insertion unit.

The bulk feeder may include a bowl shaped first feeder into which the electronic parts in a bulk form, classified according to a predetermined standard, are introduced, and a straight second feeder located between an outermost end of the first feeder and the positioning wheel.

The first feeder may include an air blower to provide the electronic parts with air in order to align the electronic parts based on orientation of front and rear surfaces thereof.

The at least one inspection unit may include a measurement unit to determine whether the electronic parts fed from the bulk feeder are defective or good, a defective part discharge unit to discharge the electronic parts determined as defective ones by the measurement unit, and a polar alignment unit to rotate or invert each electronic part to align polarity of the electronic part.

The polar alignment unit may determine whether to rotate or invert the electronic part according to whether the electronic part responds to a voltage applied thereto or not, or according to information acquired by comparing image information of the electronic part with image information stored in a database.

The positioning wheel may include a plurality of suction nozzles to suction and hold the electronic parts, and a basis shaft to be rotated so as to rotate the suction nozzles.

The electronic part insertion unit may include a carrier tape having a recessed pocket such that each electronic part is inserted into the pocket, and a guide rail to transfer the carrier tape, in which the electronic part has been received, to the part supply unit.

In accordance with another aspect of the present invention, an electronic part mounting method includes introducing electronic parts in a bulk form into a bulk feeder, transferring the introduced electronic parts to at least one inspection unit by use of a rotatably installed positioning wheel, inspecting and aligning the electronic parts, transferring the inspected and aligned electronic parts to a part insertion unit by use of the positioning wheel, inserting the electronic parts, determined as good ones by the inspection unit, into the part insertion unit, and picking up the electronic parts received in the part insertion unit to mount the electronic parts on a board.

The introduction of the electronic parts in a bulk form into the bulk feeder may include feeding the electronic parts, classified according to a predetermined standard, into a bowl shaped first feeder, and feeding the electronic parts fed into the first feeder to a straight second feeder located between an outermost end of the first feeder and the positioning wheel.

The electronic part mounting method may further include providing the electronic parts with air in order to align the electronic parts fed into the first feeder based on orientation of front and rear surfaces thereof.

The inspection and alignment of the electronic parts may include determining whether the electronic parts fed from the bulk feeder are defective or good, discharging the electronic parts determined as defective ones, and rotating or inverting each electronic part to align polarity of the electronic part.

With use of an electronic part mounting apparatus and electronic part mounting method according to the present invention, once electronic part packages are classified according to a predetermined standard, the electronic part packages in a bulk form are introduced into the electronic part mounting apparatus, thereby being able to be mounted on a printed circuit board after being subjected to a predetermined inspection process. Accordingly, the apparatus and method for mounting electronic parts according to the present invention eliminate the need of conventional taping, packing, and tape removal processes, thereby achieving the simplified entire process and a reduction in investment, labor costs, clean room construction costs, and packing material costs, and so on.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
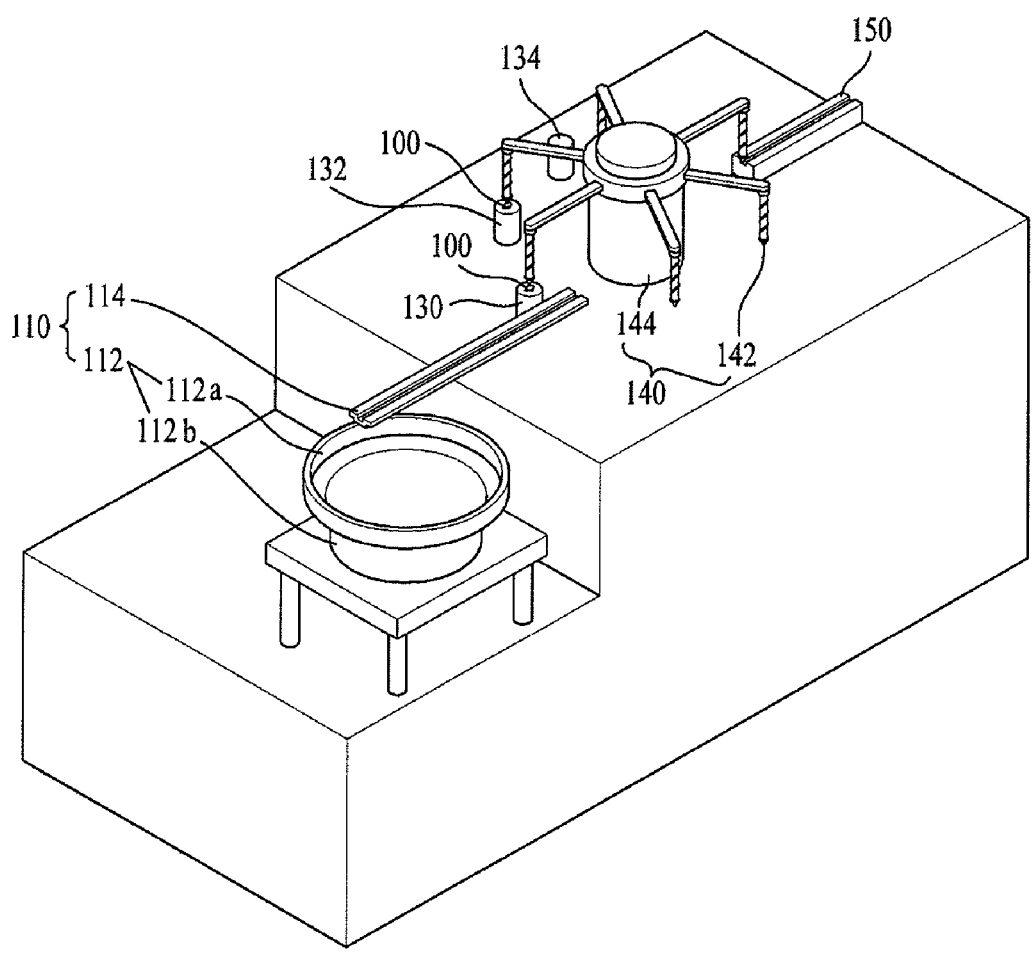
FIG. 1 is a perspective view illustrating an electronic part mounting apparatus according to the present invention.

FIG. 1 is a perspective view illustrating an electronic part mounting apparatus including a feeder according to the present invention.

Figure 7:
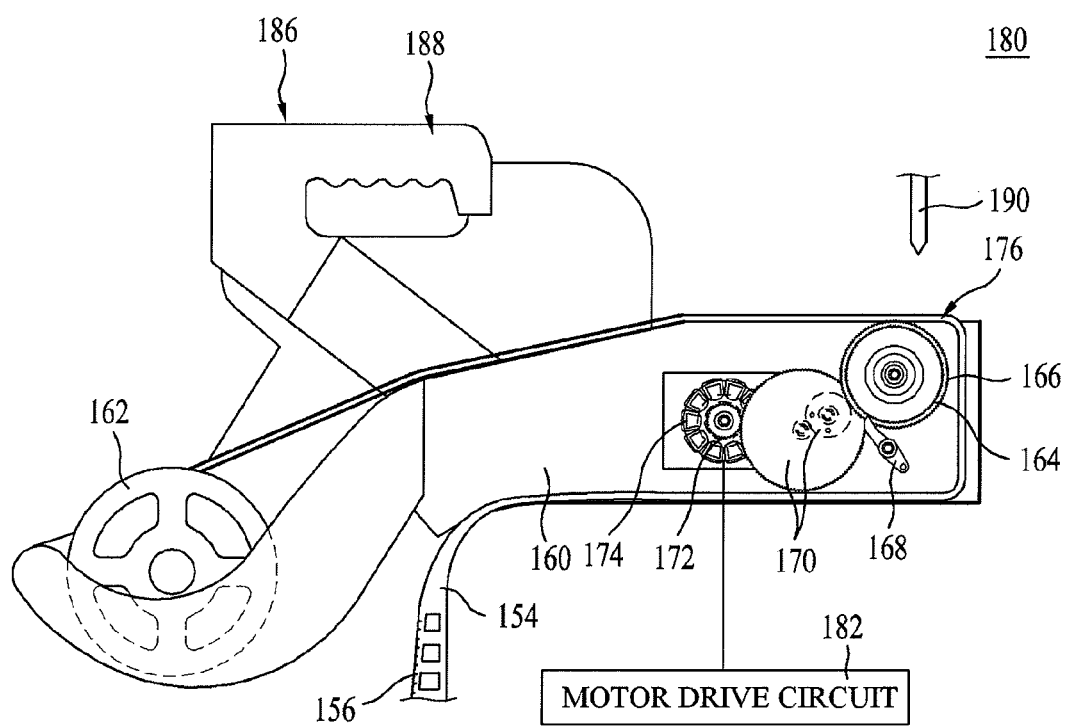
FIG. 7 is a view illustrating a part supply unit included in the electronic part mounting apparatus according to the present invention.

The electronic part mounting apparatus illustrated in FIG. 1 includes a bulk feeder 110, a positioning wheel 140, an inspection unit consisting of a measurement unit 130, a defective part discharge unit 132, and a polar alignment unit 134, an electronic part insertion unit 150, and a track type part supply unit (represented by reference numeral 180 in FIG. 7). Here, examples of an electronic part 100 include an integrated circuit, diode, condenser, resistor, light emitting diode, and so on, and in the following description, is referred to as a light emitting diode package by way of example.

Figure 2:
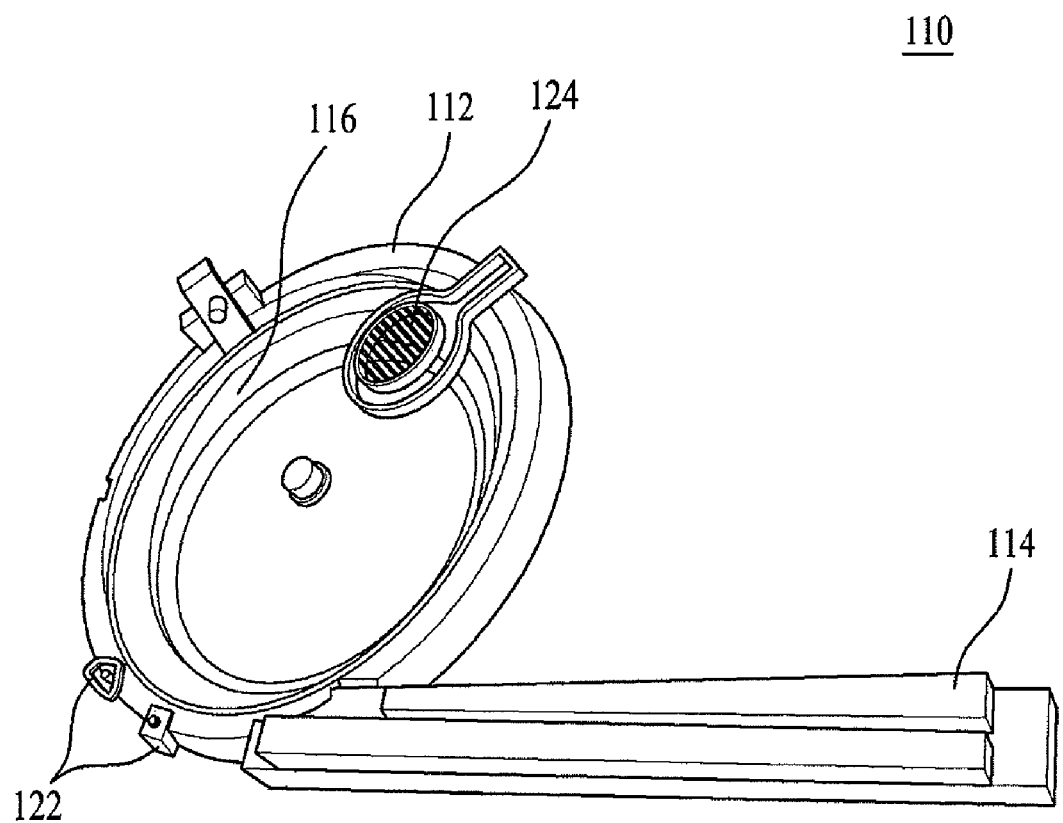
FIG. 2 is a detailed perspective view illustrating an electronic part feeder illustrated in FIG. 1.
Figure 3:
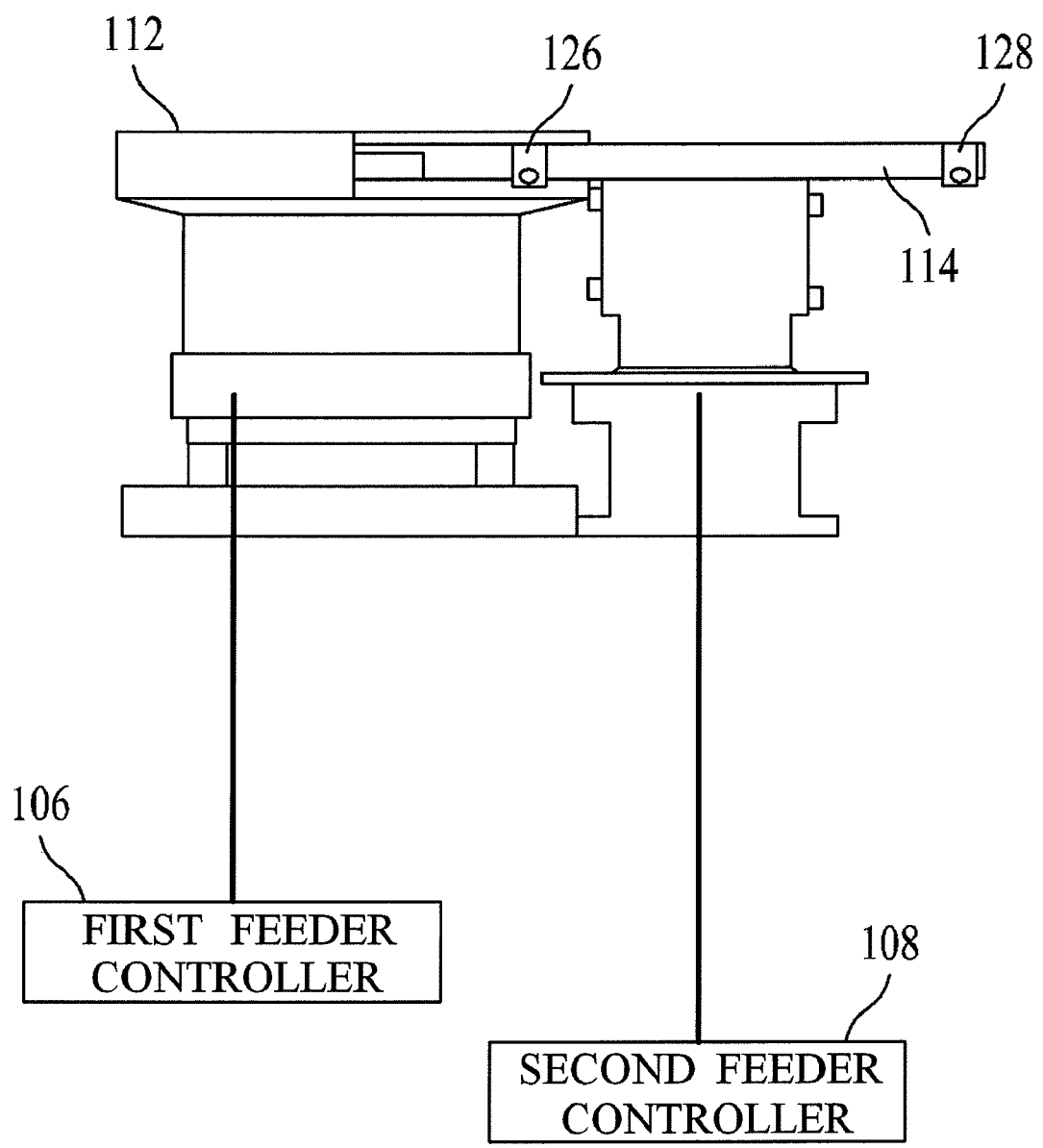
FIG. 3 is a detailed sectional view illustrating a first feeder illustrated in FIG. 2.

The bulk feeder 110, as illustrated in FIGS. 2 and 3, consists of a first feeder 112 into which electronic parts in a bulk form are introduced, and a second feeder 114 connected to the first feeder 112.

The first feeder 112 includes a bowl 112a, an inner surface of which defines an ascending helical track 116, and a vibrator 112b to support and vibrate the bowl 112a.

The vibrator 112b is used to vibrate the first feeder 112, causing the electronic parts 100 received in the bowl 112a to ascend to an upper end of the first feeder 112 along the ascending helical track 116. In this case, the electronic parts 110 are aligned with one another while being moved along the ascending helical track 116.

The electronic parts 100 in a bulk form are introduced into the bowl 112a. The electronic parts 100 to be introduced into the bowl 112a are completely subjected to die bonding, wire bonding, and dispensing processes and also, are classified according to voltage $V_F$, brightness $I_V$, and color coordinate CIE. That is, prior to being introduced into the first feeder 112, the electronic parts 100 are subjected to die bonding, wire bonding, and dispensing operations and thereafter, are classified according to voltage $V_F$, brightness $I_V$, and color coordinate CIE.

The bowl 112a, as illustrated in FIGS. 2 and 3, may include an air blower 124, the ascending helical track 116, a sorting sensor 122, a first feeder controller 106, and an electronic part full sensor 126.

The air blower 124 is used to blow ionized air to the electronic parts 100, so as to remove static electricity from the charged electronic parts 100. In addition, the air blower 124, which functions to provide the electronic parts 100 with air, serves not only to align the electronic parts 100 so as not to overlap one another, but also to realign any incorrectly aligned electronic part 100 having a downwardly facing front surface such that a rear surface of the electronic part 100 faces downward.

The ascending helical track 116 may take the form of a multi-track suitable to increase a supply quantity of the electronic parts 100.

The sorting sensor 122 is used to sense the shape of at least one surface of the front and rear surfaces of the respective electronic parts 100, thereby sorting defective ones of the electronic parts 100. More specifically, the sorting sensor 122 is able to detect the quantity of light reflected from an upper surface of each electronic part 100, determining the electronic part 100 as a defective one if the quantity of light is less than a reference value, or as a good one if the quantity of light is within the range of a reference value. Once the electronic part 100 is determined as a good one, the electronic part 100 is directed to the second feeder 114.

The electronic part full sensor 126 is used to sense the presence of the electronic part 100 when the electronic part 100 ascends to an outermost end of the ascending helical track 116 of the first feeder 112, thus enabling control of an operation starting time of the second feeder 114.

In the meantime, the first feeder 112 includes a descending portion (not shown) to allow only the aligned electronic parts 100, except for the non-aligned electronic parts 100, to be fed to the sorting sensor 122. The descending portion takes the form of a stepped portion having grooves between respective vertically arranged turns of the ascending helical track 116, to allow the non-aligned electronic parts 100, except for the aligned electronic parts 100, to descend along the grooves. In this way, the non-aligned electronic parts 100 descend into the bowl 112a of the first feeder 112, to prepare re-feeding thereof.

In this case, the aligned electronic parts 100 and the non-aligned electronic parts 100 are divided from each other based on at least one of the width and inclination angle of the ascending helical tack 116 and the center of gravity of the electronic parts 100. For example, if the width of the ascending helical track 116 is set to allow passage of the electronic parts 100 aligned in a given direction while preventing passage of the electronic parts 100 aligned in other directions, the aligned electronic parts 100 are able to pass the descending portion and to be fed to the sorting sensor 122, whereas the non-aligned electronic parts 100 descend along the descending portion thus being returned into the bowl 112a of the first feeder 112.

The second feeder 114 is a straight feeder connected to the outermost end of the ascending helical track 116 of the first feeder 112. The second feeder 114 is controlled by a second feeder controller 108 and serves to feed the electronic parts 100 directed from the first feeder 112 to the positioning wheel 140. In this case, once the electronic part 100 arrives at an end of the second feeder 114, an electronic part arrival sensor 128 illustrated in FIG. 3, which is located at the end of the second feeder 114, senses the presence of the electronic parts 100, enabling control of an operation starting time of the positioning wheel 140.

The positioning wheel 140, as illustrated in FIG. 1, includes a basis shaft 144 and a plurality of suction nozzles 142 attached to the basis shaft 144.

The basis shaft 144 is installed to enable rotation and vertical movement thereof.

The plurality of suction nozzles 142 is used to suction and hold the electronic parts 100 respectively, so as to transfer the adhered electronic parts 100 from a previous process to a subsequent process via rotation and vertical movement of the basis shaft 144.

The inspection unit may consist of the measurement unit 130, the defective part discharge unit 132, and the polar alignment unit 134.

The measurement unit 130 is used to determine the presence of defects in the exterior appearance of the electronic parts 100 fed by the plurality of suction nozzles 142. To this end, the measurement unit 130 may function to form an image of each surface of the electronic parts 100 so as to inspect the exterior appearance of the electronic parts 100 in terms of damage to the electronic parts 100, exposure of or damage to electrodes, the absence or superabundance of electrodes, length deformation of electrodes, size defects, pin holes, cutting errors, and so on.

Figure 4:
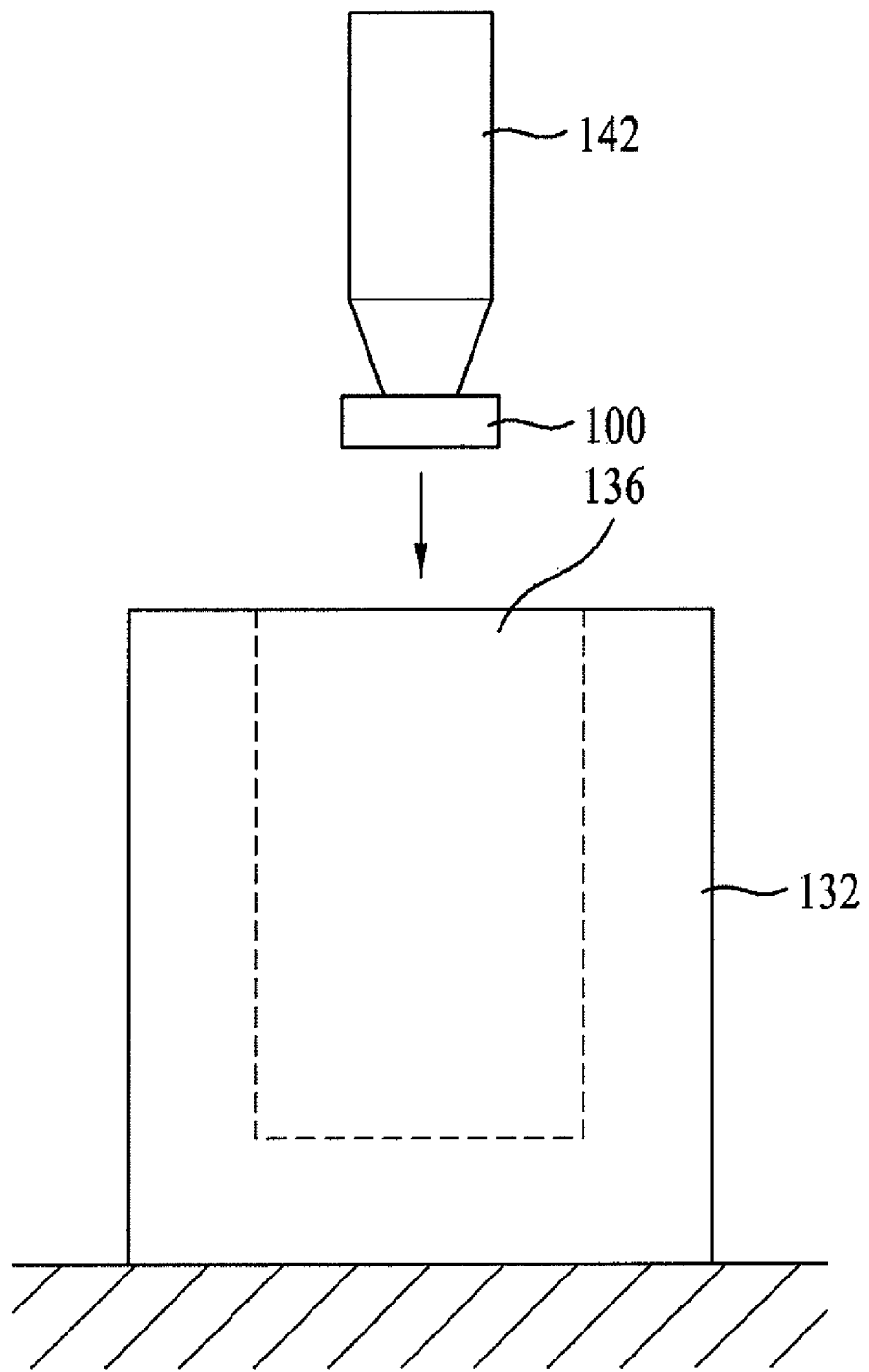
FIG. 4 is a sectional view illustrating a defective part discharge unit illustrated in FIG. 1.

The defective part discharge unit 132, as illustrated in FIG. 4, is used to discharge the electronic parts 100, determined as defective ones by the measurement unit 130, into a discharge space 136, thereby allowing only the electric parts 100, determined as good ones, to be fed to the polar alignment unit 134.

Figure 5A:
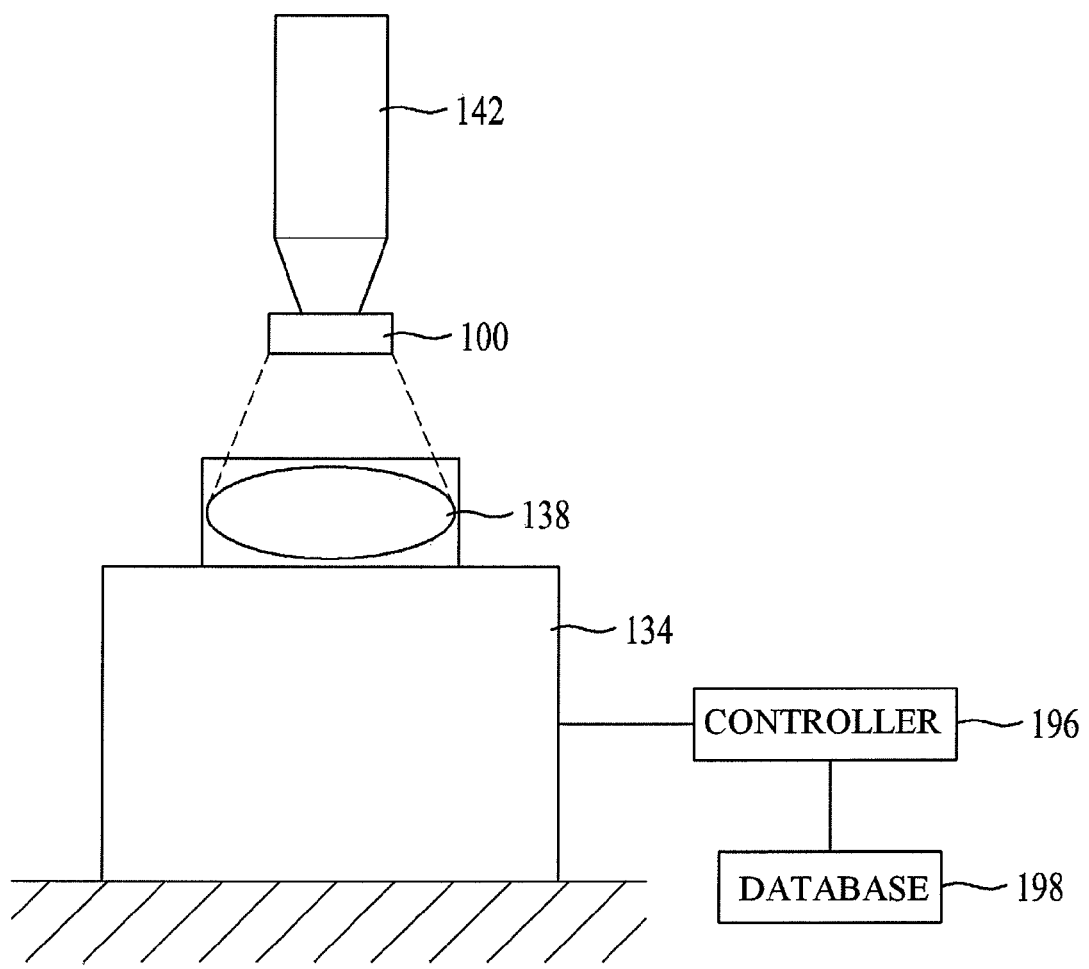
FIGS. 5A to 5C are views illustrating a polar alignment unit illustrated in FIG. 1.

The polar alignment unit 134 realizes polar alignment of the electronic part 100 by using image information acquired by an image forming unit 138 as illustrated in FIG. 5A, or by applying electric signals to the electronic part 100.

Considering the case where the polar alignment of the electronic part 100 is realized via the image forming unit 138, the polar alignment unit 134, as illustrated in FIG. 5A, includes the image forming unit 138, a controller 196, and a database 198.

The image forming unit 138 forms an image of the electronic part 100 suctioned to the suction nozzle 142.

The controller 196 compares the acquired image information with image information stored in the database 198, thereby calculating a rotated or inverted angle of the electronic part 100. Referring to FIG. 5C, a rotation/inversion unit 120 is used to rotate or invert the electronic part 100 according to the calculated rotated or inverted angle of the electronic part 100, realizing the polar alignment of the electronic part 100.

Figure 5B:
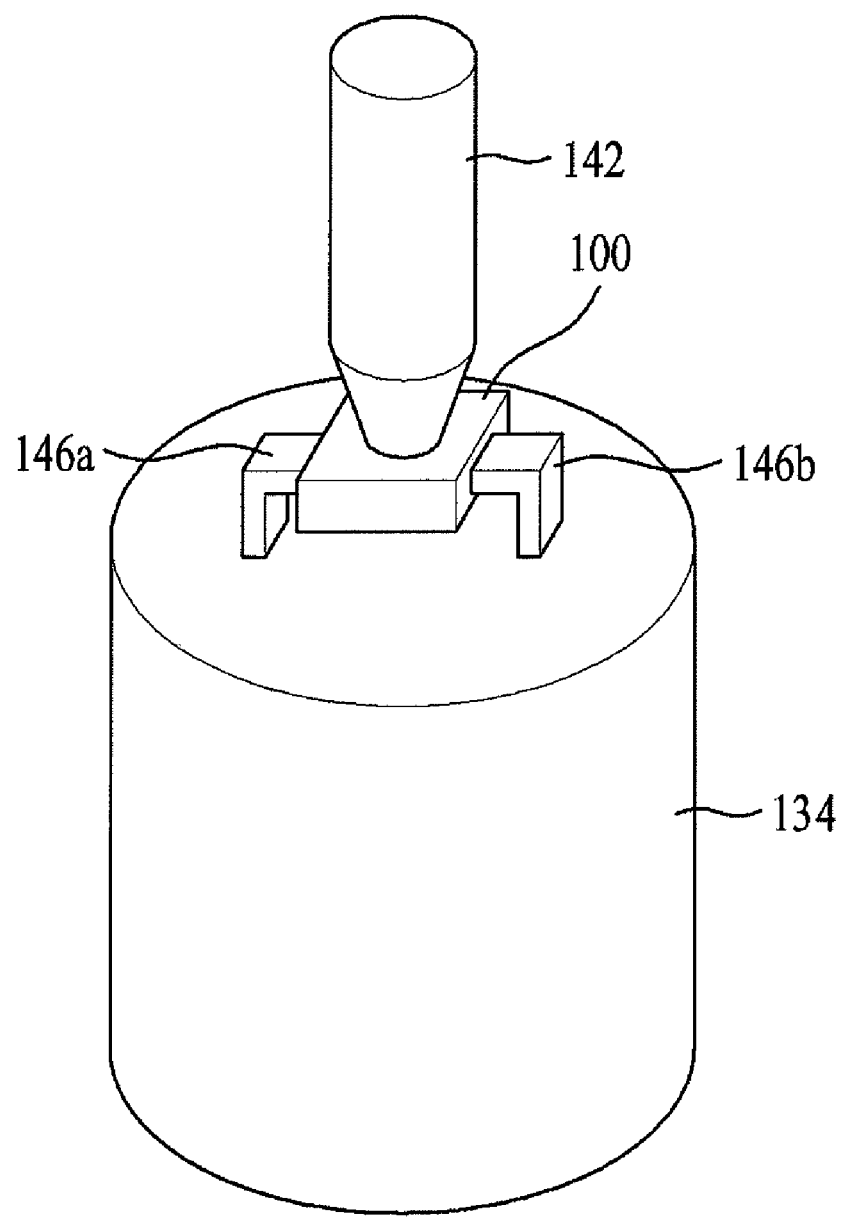
Figure 5C:
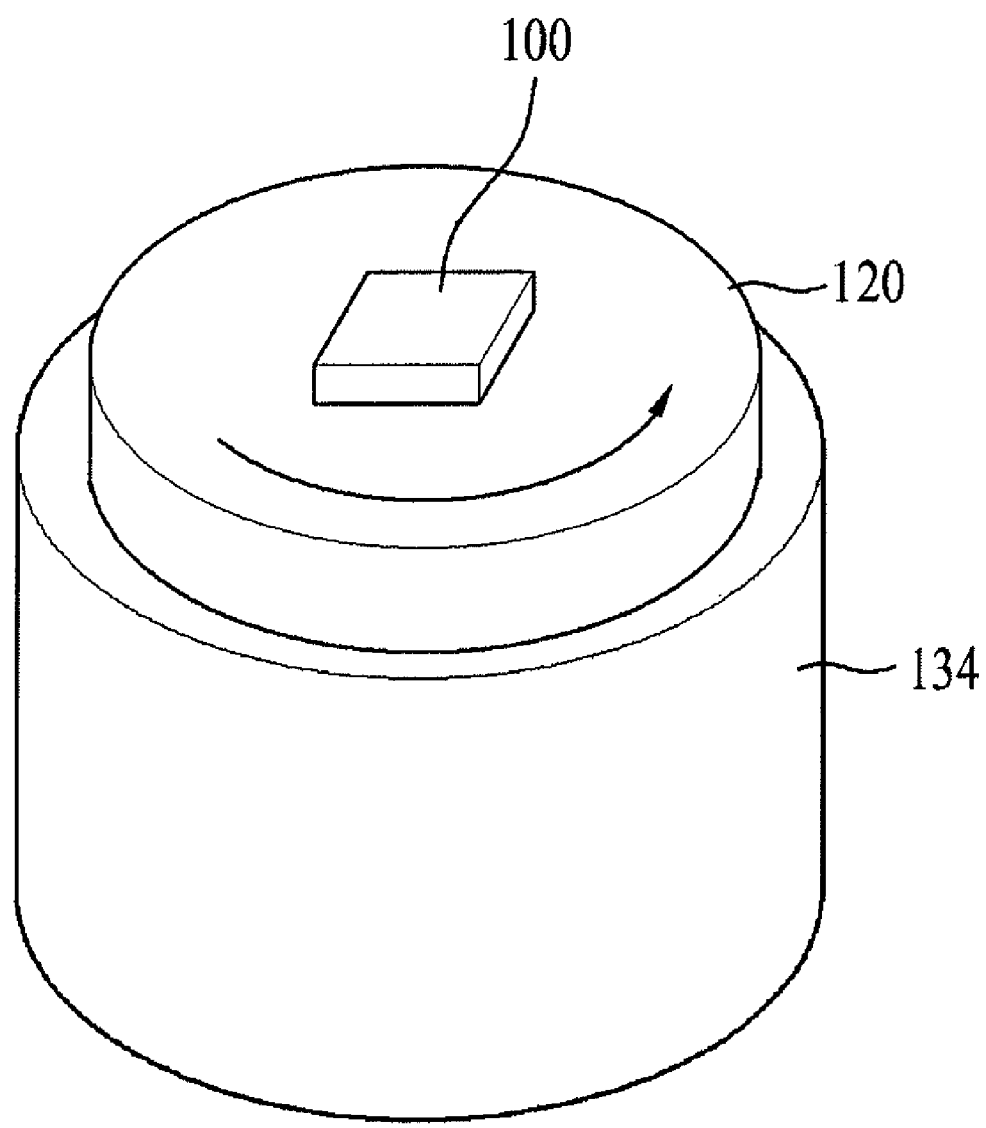

On the other hand, considering the case where the polar alignment of the electronic part 100 is realized via application of electric signals, as illustrated in FIG. 5B, information related to the polarity of the electronic part 100 is acquired based on electric signals applied to both ends 146a and 146b of the electronic part 100. For example, if the electronic part 100 is a light emitting diode, polarity information is acquired according to whether the electronic part 100 emits light or not in response to a forward voltage or invert voltage applied thereto. As illustrated in FIG. 5C, the electronic part 100 is rotated or inverted by use of the rotation/inversion unit 120 according to the acquired polarity information, resulting in the polar alignment of the electronic part 100.

Figure 6:
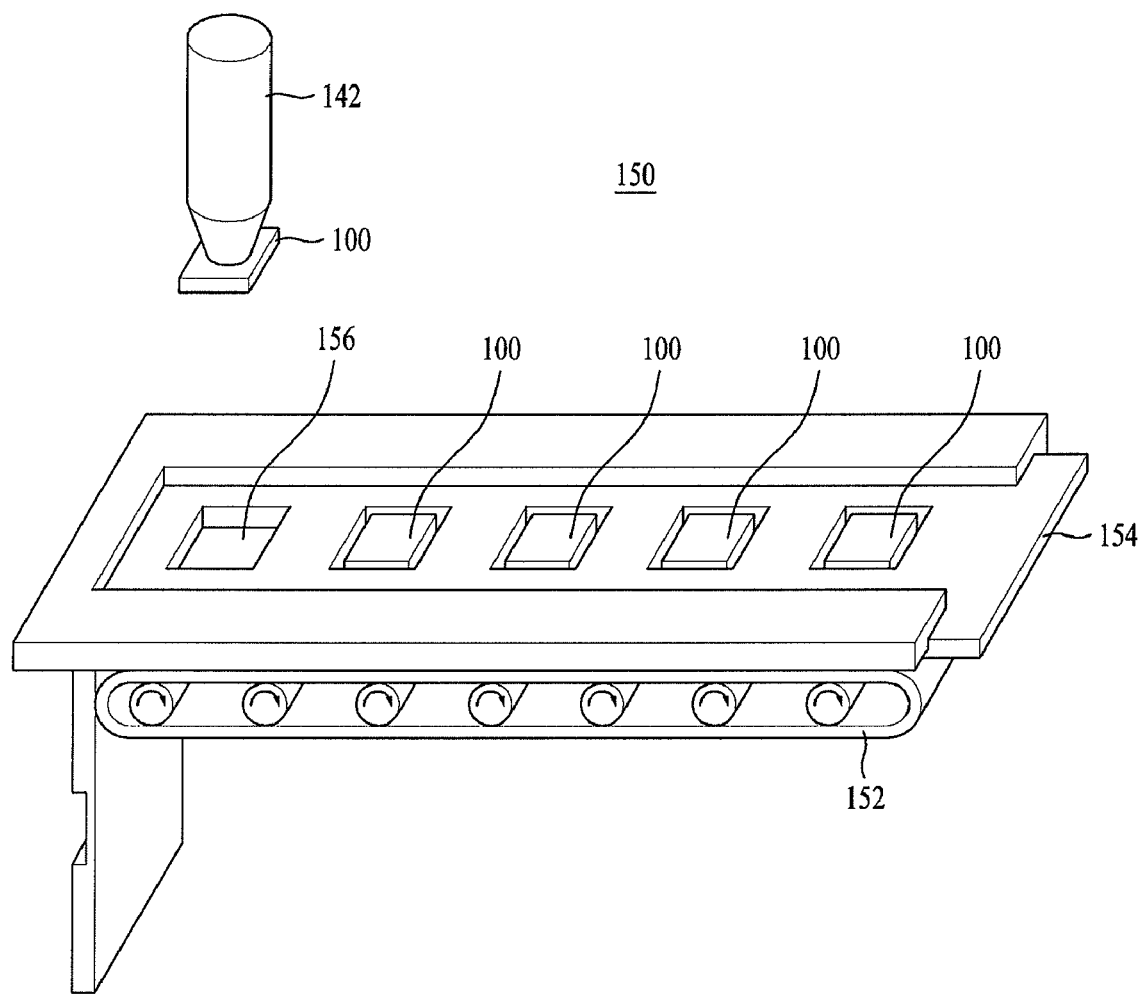
FIG. 6 is a perspective view illustrating a part insertion unit illustrated in FIG. 1.

The electronic part insertion unit 150, as illustrated in FIG. 6, includes a carrier tape 154 and a guide rail 152.

The carrier tape 154 has recessed pockets 156 successively arranged with a constant interval, such that the electronic parts 100 are able to be inserted into the pockets 156.

The guide rail 152 serves to move the carrier tape 154 in which the electronic parts 100 have been received.

As described above, after the electronic parts 100 are inserted into the pockets 156 of the carrier tape 154, the electronic parts 100 are transferred to the part supply unit 180 along the guide rail 152.

The part supply unit 180, as illustrated in FIG. 7, includes a transfer roll 162, a pitch transfer device 176, a grip member 188, and a display 186.

The grip member 188 is provided at one side of a body 160 of the track type part supply unit 180, to allow a user to grip and move the part supply unit 180.

The display 186 is provided at the grip member 188 to visually output an operational state of the part supply unit 180 using characters, etc., to the user at the outside.

The transfer roll 162 is used to transfer the carrier tape 154, in which the electronic parts 100 have been received, to the pitch transfer device 176. Alternatively, the transfer roll 162 may be substituted by a winding roll, around which the carrier tape 154 containing the electronic parts 100 inserted therein is wound.

The pitch transfer device 176 is used to transfer the carrier tape 154, in which the electronic parts 100 have been received, to a pickup position of a pickup unit 190 on a per predetermined pitch basis.

To this end, the pitch transfer device 176 includes a feeding motor 174, a power transmission gear 170, a drive wheel 166, a latch wheel 164, and a latch stopper 168.

The feeding motor 174 is rotated upon receiving drive signals transmitted from a motor drive circuit 182.

A drive gear 172 is coaxially coupled to the feeding motor 174 and in turn, the power transmission gear 170 is engaged with the drive gear 172. Thus, the power transmission gear 170 is rotated upon receiving power generated by the feeding motor 174.

The drive wheel 166 and the latch wheel 164 are rotated upon receiving power from the power transmission gear 170, thereby serving to transfer the carrier tape 154, in which the electronic parts 100 have been received, to the pickup position of the pickup unit 190 on a per pitch basis. In particular, the drive wheel 166 is provided at an outer circumference thereof with gear tooth such that the gear tooth are inserted into the pockets 156 of the carrier tape 154 to enable transfer of the carrier tape 154.

The latch stopper 168 serves to limit a rotation direction of the latch wheel 164, in order to prevent the drive wheel 166 from rotating in an inversion direction during supply of the electronic parts 100.

Figure 8:
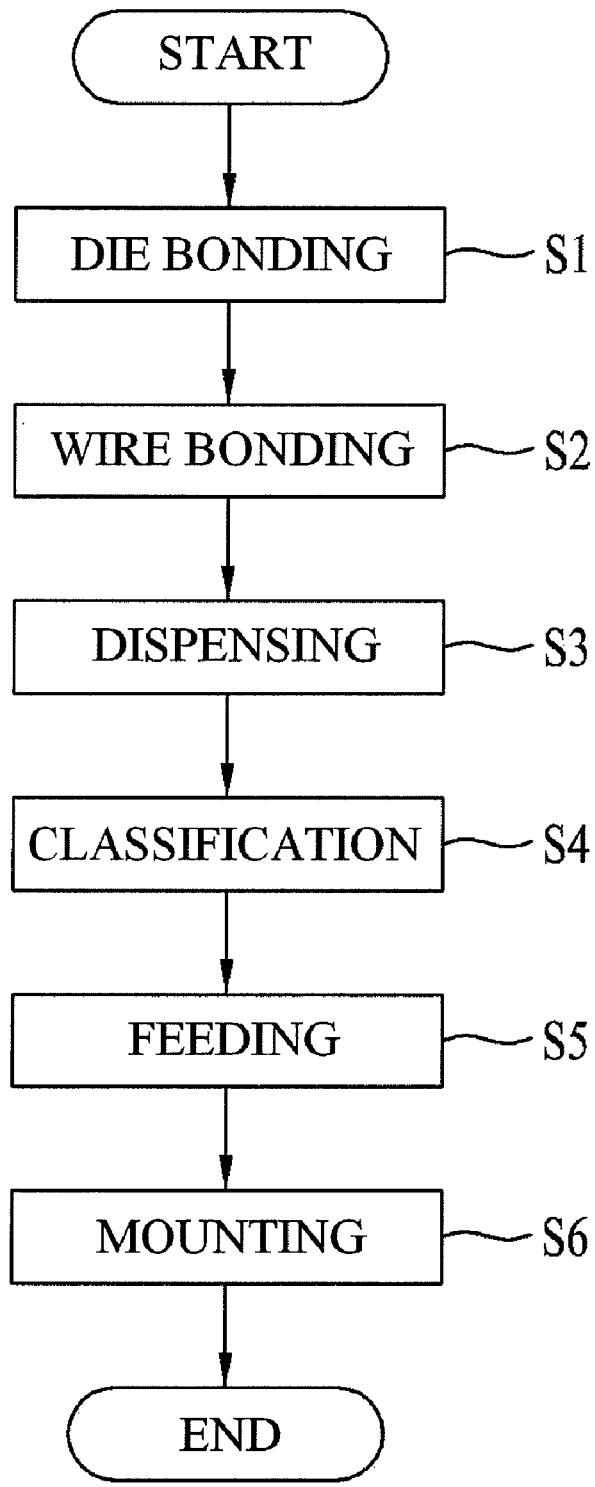
FIG. 8 is a flow chart illustrating an electronic part mounting method according to the present invention.

FIG. 8 is a flow chart illustrating an electronic part mounting method according to the present invention.

Referring to FIG. 8, after a substrate is prepared, electronic parts are die-bonded to a mounting space of the substrate (S1).

Next, electrodes of the electronic parts are connected respectively to electrode plates of the substrate by wire bonding (S2), and then, the mounting space in which the electronic parts have been mounted is directly molded, or is molded after completion of a dispensing process (S3).

Next, the electronic parts are classified according to voltage, brightness, color coordinate, and so on (S4). The classified electronic parts in a bulk form are introduced into the bulk feeder (S5).

Next, after passing through the measurement unit, the defective part discharge unit, the polar alignment unit, and the electronic part insertion unit via operation of the positioning wheel, the electronic parts are picked up from the track type part supply unit and then, are mounted on a printed circuit board (S6).

As is apparent from the above description, with use of an electronic part mounting apparatus and electronic part mounting method according to the present invention, once electronic part packages are classified according to a predetermined standard, the electronic part packages in a bulk form are introduced into the electronic part mounting apparatus, thereby being able to be mounted on a printed circuit board after being subjected to a predetermined inspection process.

Accordingly, the apparatus and method for mounting electronic parts according to embodiments of the present invention have the effect of eliminating the need of conventional taping, packing, and tape removal processes, thereby achieving a simplified overall process and a reduction in investment, labor costs, clean room construction costs, and packing material costs, and so on. More particularly, although a conventional mounting process including taping, packing, and tape removal processes requires costs of about 2.23 billion won, the present invention is capable of reducing mounting costs to about 1.7 billion won owing to elimination of the conventional processes, resulting in cost savings of about 530 million won.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electronic part mounting apparatus comprising:
   a bulk feeder into which electronic parts in a bulk form are introduced;
   at least one inspection unit to inspect and align the electronic parts directed from the bulk feeder;
   an electronic part insertion unit to receive the electronic parts which have been completely inspected in the inspection unit, wherein the electronic part insertion unit and the inspection unit are coplanar to each other;
   a positioning wheel to roll over the bulk feeder, the inspection unit, and the electronic part insertion unit surrounded a center of the positioning wheel; and
   a part supply unit to pick up the electronic parts received in the electronic part insertion unit,
   wherein the at least one inspection unit includes:
   a polar alignment unit to rotate or invert each electronic part to align a polarity of the electronic part,
   wherein the positioning wheel is in direct contact with the bulk feeder and the inspection unit when the electronic parts are transferred from the bulk feeder to the inspection unit via the positioning wheel, and the positioning wheel is in direct contact with the inspection unit and the electronic part insertion unit when the electronic parts are transferred from the inspection unit to the electronic part insertion unit via the positioning wheel, and
   wherein a distance between the inspection unit and the center of the positioning wheel when the inspection unit is in the direct contact with the positioning wheel is substantially same as a distance between the electronic part insertion unit and the center of the positioning wheel when the electronic part insertion unit is in the direct contact with the positioning wheel.

2. The electronic part mounting apparatus according to claim 1, wherein the bulk feeder includes:
   a bowl shaped first feeder into which the electronic parts in a bulk form, classified according to a predetermined standard, are introduced; and
   a straight second feeder located between an outermost end of the first feeder and the positioning wheel.

3. The electronic part mounting apparatus according to claim 2, wherein the first feeder includes an air blower to provide the electronic parts with air in order to align the electronic parts based on orientation of front and rear surfaces thereof.

4. The electronic part mounting apparatus according to claim 1, wherein the at least one inspection unit further includes:
   a measurement unit to determine whether the electronic parts fed from the bulk feeder are defective or good; and
   a defective part discharge unit to discharge the electronic parts determined as defective ones by the measurement unit.

5. The electronic part mounting apparatus according to claim 1, wherein the polar alignment unit determines whether to rotate or invert the electronic part according to whether the electronic part responds to a voltage applied thereto or not, or according to information acquired by comparing image information of the electronic part with image information stored in a database.

6. The electronic part mounting apparatus according to claim 1, wherein the positioning wheel includes:
   a plurality of suction nozzles to suction and hold the electronic parts; and
   a basis shaft to be rotated so as to rotate the suction nozzles.

7. The electronic part mounting apparatus according to claim 1, wherein the electronic part insertion unit includes:
   a carrier tape having a recessed pocket such that each electronic part is inserted into the pocket; and
   a guide rail to transfer the carrier tape, in which the electronic part has been received, to the part supply unit.

8. The electronic part mounting apparatus according to claim 1, wherein the distance between the inspection unit and the center of the positioning wheel when the inspection unit is in the direct contact with the positioning wheel is the same as the distance between the electronic part insertion unit and the center of the positioning wheel when the electronic part insertion unit is in the direct contact with the positioning wheel.

* * * * *